US010878863B2

(12) United States Patent
Manning

(10) Patent No.: US 10,878,863 B2
(45) Date of Patent: *Dec. 29, 2020

(54) APPARATUSES AND METHODS FOR PERFORMING LOGICAL OPERATIONS USING SENSING CIRCUITRY

(71) Applicant: Micron Technology, Inc., Boise, ID (US)

(72) Inventor: Troy A. Manning, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/741,466

(22) Filed: Jan. 13, 2020

(65) Prior Publication Data
US 2020/0152246 A1 May 14, 2020

Related U.S. Application Data

(63) Continuation of application No. 16/253,750, filed on Jan. 22, 2019, now Pat. No. 10,535,384, which is a (Continued)

(51) Int. Cl.
*G11C 16/04* (2006.01)
*H03K 19/00* (2006.01)
(Continued)

(52) U.S. Cl.
CPC ............... *G11C 7/22* (2013.01); *G06F 3/065* (2013.01); *G06F 3/068* (2013.01); *G06F 3/0611* (2013.01);
(Continued)

(58) Field of Classification Search
CPC ..... G11C 7/22; G11C 7/1087; G11C 11/4074; G11C 7/065; G11C 11/4091; G11C 7/06;
(Continued)

(56) References Cited

U.S. PATENT DOCUMENTS

| 4,380,046 A | 4/1983 | Fung |
| 4,435,792 A | 3/1984 | Bechtolsheim |

(Continued)

FOREIGN PATENT DOCUMENTS

| CN | 101281781 | 10/2008 |
| CN | 101770802 | 7/2010 |

(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.

(Continued)

*Primary Examiner* — Vibol Tan
(74) *Attorney, Agent, or Firm* — Brooks, Cameron & Huebsch, PLLC

(57) ABSTRACT

The present disclosure includes apparatuses and methods related to performing logical operations using sensing circuitry. An example apparatus comprises an array of memory cells and sensing circuitry comprising a primary latch coupled to a sense line of the array. The sensing circuitry can be configured to perform a first operation phase of a logical operation by sensing a memory cell coupled to the sense line, perform a number of intermediate operation phases of the logical operation by sensing a respective number of different memory cells coupled to the sense line, and accumulate a result of the first operation phase and the number of intermediate operation phases in a secondary latch coupled to the primary latch without performing a sense line address access.

20 Claims, 8 Drawing Sheets

Related U.S. Application Data continuation of application No. 15/899,187, filed on Feb. 19, 2018, now Pat. No. 10,186,303, which is a continuation of application No. 15/439,681, filed on Feb. 22, 2017, now Pat. No. 9,899,068, which is a continuation of application No. 15/051,112, filed on Feb. 23, 2016, now Pat. No. 9,589,607, which is a continuation of application No. 14/538,399, filed on Nov. 11, 2014, now Pat. No. 9,275,701, which is a continuation of application No. 13/962,399, filed on Aug. 8, 2013, now Pat. No. 8,971,124.

(51) Int. Cl.
    *G11C 7/22*       (2006.01)
    *G06F 12/00*      (2006.01)
    *G11C 7/06*       (2006.01)
    *G11C 11/4074*    (2006.01)
    *G11C 11/4091*    (2006.01)
    *G06F 3/06*       (2006.01)
    *G06F 7/523*      (2006.01)
    *H03K 19/1776*    (2020.01)
    *G11C 7/10*       (2006.01)

(52) U.S. Cl.
    CPC ............ *G06F 3/0625* (2013.01); *G06F 7/523* (2013.01); *G06F 12/00* (2013.01); *G11C 7/06* (2013.01); *G11C 7/065* (2013.01); *G11C 7/1087* (2013.01); *G11C 11/4074* (2013.01); *G11C 11/4091* (2013.01); *H03K 19/0013* (2013.01); *H03K 19/1776* (2013.01)

(58) Field of Classification Search
    CPC ...... G06F 3/0611; G06F 7/523; G06F 3/0625; G06F 3/065; G06F 3/068; G06F 12/00; H03K 19/0013; H03K 19/1776
    See application file for complete search history.

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Gamey |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,463,501 B2 | 12/2008 | Dosaka |
| 7,535,769 B2 | 5/2009 | Cernea |
| 7,546,438 B2 | 6/2009 | Chung |
| 7,562,198 B2 | 7/2009 | Noda et al. |
| 7,573,756 B2 | 8/2009 | Seo |
| 7,574,466 B2 | 8/2009 | Beaumont |
| 7,602,647 B2 | 10/2009 | Li et al. |
| 7,603,605 B2 | 10/2009 | Mittal |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,439 B2 | 9/2010 | Arai |

(56) References Cited

U.S. PATENT DOCUMENTS

| | | |
|---|---|---|
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,130,582 B2 | 3/2012 | Shimano |
| 8,164,942 B2 | 4/2012 | Gebara et al. |
| 8,208,328 B2 | 6/2012 | Hong |
| 8,208,331 B2 | 6/2012 | Lin et al. |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shinano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 10,289,542 B2* | 5/2019 | Zawodny .................. G11C 7/06 |
| 10,388,333 B2* | 8/2019 | Penney ................. G11C 7/1006 |
| 10,416,927 B2* | 9/2019 | Lea ..................... G06F 15/7821 |
| 10,628,085 B2* | 4/2020 | Lea ........................ G06F 3/0673 |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0101231 A1 | 5/2006 | Higashida |
| 2006/0146612 A1 | 7/2006 | Lim et al. |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0235449 A1 | 9/2011 | Chen et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0089793 A1 | 4/2012 | Nazar et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron |
| 2014/0185395 A1 | 7/2014 | Seo |
| 2014/0215185 A1 | 7/2014 | Danielsen |

(56) References Cited

U.S. PATENT DOCUMENTS

| | | |
|---|---|---|
| 2014/0250279 A1 | 9/2014 | Manning |
| 2014/0344934 A1 | 11/2014 | Jorgensen |
| 2015/0134713 A1 | 5/2015 | Wheeler |
| 2015/0324290 A1 | 11/2015 | Leidel |
| 2015/0325272 A1 | 11/2015 | Murphy |
| 2015/0356006 A1 | 12/2015 | Pemer |

FOREIGN PATENT DOCUMENTS

| | | |
|---|---|---|
| CN | 102141905 | 8/2011 |
| CN | 102667752 | 9/2012 |
| CN | 102822896 | 12/2012 |
| CN | 105027212 | 11/2015 |
| EP | 0214718 | 3/1987 |
| EP | 2026209 | 2/2009 |
| JP | H0831168 | 2/1996 |
| JP | 2006127460 | 5/2006 |
| JP | 2007206849 | 8/2007 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.
"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
Debnath, Biplob, Bloomflash: Bloom Filter on Flash-Based Storage, 2011 31st Annual Conference on Distributed Computing Systems, Jun. 20-24, 2011, 10 pgs.
Pagiamtzis, Kostas, "Content-Addressable Memory Introduction", Jun. 25, 2007, (6 pgs.), retrieved from: http://www.pagiamtzis.com/cam/camintro.
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
International Search Report and Written Opinion for PCT Application No. PCT/US2013/043702, dated Sep. 26, 2013, (11 pgs.).
Elliot, et al., "Computational RAM: Implementing Processors in Memory", Jan.-Mar. 1999, (10 pgs.), vol. 16, Issue 1, IEEE Design and Test of Computers Magazine.
Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.
Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.
Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entiled "Weighted Search and Compare in a Memory Device," filed Jan. 17, 2013, (25 pgs.).
U.S. Appl. No. 13/774,636, entitled, "Memory as a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).
International Search Report and Written Opinion for related PCT Patent Application No. PCT/US2014/049881, dated Nov. 17, 2014, 11 pages.
Office Action for Taiwan Patent Application No. 103107275, dated Jul. 31, 2015, 15 pages.
Notice of Preliminary Rejection for Korea Patent Applicaton No. 10-2015-7027181, dated Nov. 24, 2015, 6 pages.
Office Action for China Patent Application No. 201480011890.4, dated Mar. 2, 2016, 10 pages..
Office Action for Japan Patent Application No. 2015-560213, dated Feb. 9, 2016, 8 pages.
Office Action for U.S. Appl. No. 13/784,219, dated Oct. 9, 2014, 11 pages.
International Search Report and Written Opinion for PCT Application No. PCT/US2014/017259, dated May 27, 2014, 13 pages.
Notice of Preliminary Rejection for related Korea Patent Application No. 10-2016-7005826, dated Apr. 12, 2016, 11 pages.
Notice of Rejection for related Japan Patent Application No. 2016-515939, dated Jul. 26, 2016, 7 pages..
Notice of Rejection for Korea Patent Application No. 10-2016-7017172, dated Jul. 12, 2016, 7 pages.
Office Action for related China Patent Application No. 201480050838.X, dated Oct. 17, 2016, 12 pages.
Search Report for EP Patent Application No. 14760332.8, dated Dec. 16, 2016, 8 pages.
Supplementary European Search Report for related EP Patent Application No. 14834674.5, dated Apr. 24, 2017, 9 pages.

\* cited by examiner

US 10,878,863 B2

APPARATUSES AND METHODS FOR PERFORMING LOGICAL OPERATIONS USING SENSING CIRCUITRY

PRIORITY INFORMATION

This application is a Continuation of U.S. application Ser. No. 16/253,750, filed Jan. 22, 2019, which issues as U.S. Pat. No. 10,535,384 on Jan. 14, 2020, which is a Continuation of U.S. application Ser. No. 15/899,187, filed Feb. 19, 2018, which issues as U.S. Pat. No. 10,168,303 on Jan. 22, 2019, which is a Continuation of U.S. application Ser. No. 15/439,681, filed Feb. 22, 2017, which issued as U.S. Pat. No. 9,899,068 on Feb. 20, 2018, which is a Continuation of U.S. application Ser. No. 15/051,112, filed Feb. 23, 2016, which issued as U.S. Pat. No. 9,589,607 on Mar. 7, 2017, which is a Continuation of U.S. application Ser. No. 14/538,399, filed Nov. 11, 2014, which issued as U.S. Pat. No. 9,275,701 on Mar. 1, 2016, which is a Continuation of U.S. application Ser. No. 13/962,399, filed Aug. 8, 2013, which issued as U.S. Pat. No. 8,971,124 on Mar. 3, 2015, the contents of which are incorporated herein by reference.

TECHNICAL FIELD

The present disclosure relates generally to semiconductor memory and methods, and more particularly, to apparatuses and methods related to performing logical operations using sensing circuitry.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR logical operations on data (e.g., one or more operands). For example, the functional unit circuitry (FUC) may be used to perform arithmetic operations such as addition, subtraction, multiplication, and/or division on operands.

A number of components in an electronic system may be involved in providing instructions to the FUC for execution. The instructions may be generated, for instance, by a processing resource such as a controller and/or host processor. Data (e.g., the operands on which the instructions will be executed) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the instructions and/or data may also be sequenced and/or buffered.

In many instances, the processing resources (e.g., processor and/or associated FUC) may be external to the memory array, and data is accessed via a bus between the processing resources and the memory array to execute a set of instructions. Processing performance may be improved in a processor-in-memory (PIM) device, in which a processor may be implemented internal and/or near to a memory (e.g., directly on a same chip as the memory array), which may conserve time and power in processing. However, such PIM devices may have various drawbacks such as an increased chip size. Moreover, such PIM devices may still consume undesirable amounts of power in association with performing logical operations (e.g., compute functions).

BRIEF DESCRIPTION OF THE DRAWINGS

FIGS. 2C-1 and 2C-2 illustrate timing diagrams associated with performing a number of logical operations using sensing circuitry in accordance with a number of embodiments of the present disclosure.

FIGS. 2D-1 and 2D-2 illustrate timing diagrams associated with performing a number of logical operations using sensing circuitry in accordance with a number of embodiments of the present disclosure.

DETAILED DESCRIPTION

Figure 1:
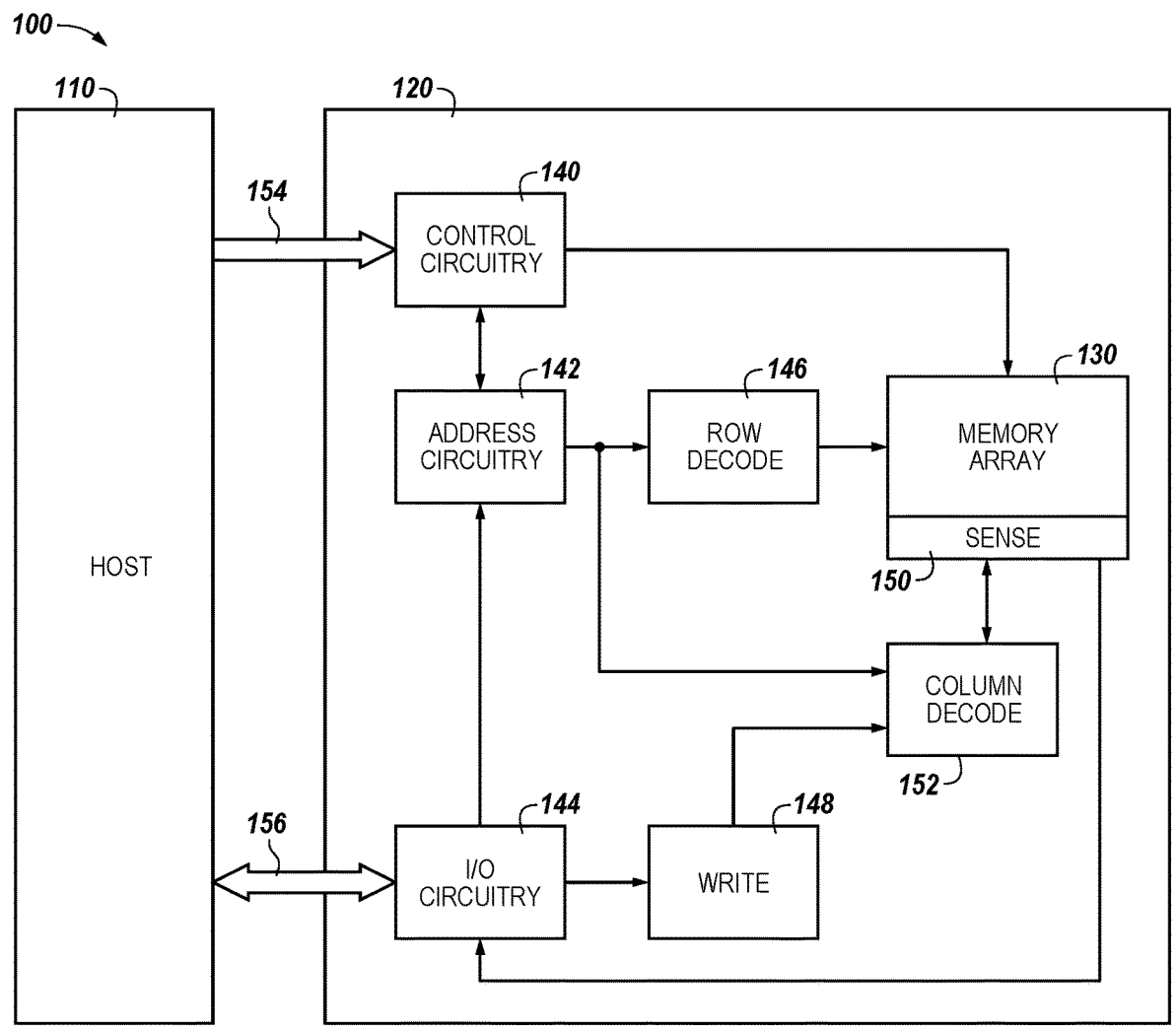
FIG. 1 is a block diagram of an apparatus in the form of a computing system including a memory device in accordance with a number of embodiments of the present disclosure.

The present disclosure includes apparatuses and methods related to performing logical operations using sensing circuitry. An example apparatus comprises an array of memory cells and sensing circuitry comprising a primary latch coupled to a sense line of the array. The sensing circuitry can be configured to perform a first operation phase of a logical operation by sensing a memory cell coupled to the sense line, perform a number of intermediate operation phases of the logical operation by sensing a respective number of different memory cells coupled to the sense line, and accumulate a result of the first operation phase and the number of intermediate operation phases in a secondary latch coupled to the primary latch without performing a sense line address access.

A number of embodiments of the present disclosure can provide improved parallelism and/or reduced power consumption in association with performing compute functions as compared to previous systems such as previous PIM systems and systems having an external processor (e.g., a processing resource located external from a memory array, such as on a separate integrated circuit chip). For instance, a number of embodiments can provide for performing fully complete compute functions such as integer add, subtract, multiply, divide, and CAM (content addressable memory) functions without transferring data out of the memory array and sensing circuitry via a bus (e.g., data bus, address bus, control bus), for instance. Such compute functions can involve performing a number of logical operations (e.g., AND, OR, NOT, NOR, NAND, XOR, etc.). However, embodiments are not limited to these examples. For instance, performing logical operations can include performing a number of non-boolean logic operations such as copy, compare, destroy, etc.

In previous approaches, data may be transferred from the array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate logical operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line address access (e.g., firing of a column decode signal) in order to transfer data from sense lines onto I/O lines (e.g., local I/O lines), moving the data to the array periphery, and providing the data to the compute function.

Furthermore, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example. A number of embodiments of the present disclosure include sensing circuitry formed on pitch with memory cells of the array and capable of performing compute functions such as those described herein below.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 206 may reference element "06" in FIG. 2A, and a similar element may be referenced as 306 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines (which may be referred to herein as digit lines or data lines). Although a single array 130 is shown in FIG. 1, embodiments are not so limited. For instance, memory device 120 may include a number of arrays 130 (e.g., a number of banks of DRAM cells). An example DRAM array is described in association with FIG. 2A.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Control circuitry 140 decodes signals provided by control bus 154 from the host 110. These signals can include chip enable signals, write enable signals, and address latch signals that are used to control operations performed on the memory array 130, including data read, data write, and data erase operations. In various embodiments, the control circuitry 140 is responsible for executing instructions from the host 110. The control circuitry 140 can be a state machine, a sequencer, or some other type of controller.

An example of the sensing circuitry 150 is described further below in association with FIGS. 2A and 3. For instance, in a number of embodiments, the sensing circuitry 150 can comprise a number of sense amplifiers (e.g., sense amplifier 206 shown in FIG. 2A or sense amplifier 306 shown in FIG. 3) and a number of compute components (e.g., compute component 231 shown in FIG. 2A), which may comprise an accumulator and can be used to perform logical operations (e.g., on data associated with complementary sense lines). In a number of embodiments, the sensing circuitry (e.g., 150) can be used to perform logical operations using data stored in array 130 as inputs and store the results of the logical operations back to the array 130 without transferring via a sense line address access (e.g., without firing a column decode signal). As such, various compute functions can be performed within using sensing circuitry 150 rather than (or in association with) being performed by processing resources external to the sensing circuitry (e.g., by a processor associated with host 110 and/or other processing circuitry, such as ALU circuitry, located on device 120 (e.g., on control circuitry 140 or elsewhere)). In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry (e.g., 150) is configured to perform logical operations on data stored in memory (e.g., array 130) and store the result back to the memory without activating (e.g., enabling) an I/O line (e.g., a local I/O line) coupled to the sensing circuitry, which can be formed on pitch with the memory cells of the array. Activating an I/O line can include enabling (e.g., turning on) a transistor having a gate coupled to a decode signal (e.g., a column decode signal) and a source/drain coupled to the I/O line. Embodiments are not so limited. For instance, in a number of embodiments, the sensing circuitry (e.g., 150) can be used to perform logical operations without activating column decode lines of the array; however, the local I/O line(s) may be activated in order to transfer a result to a suitable location other than back to the array (e.g., to an external register).

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth of such an external processing resource). However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Figure 2A:
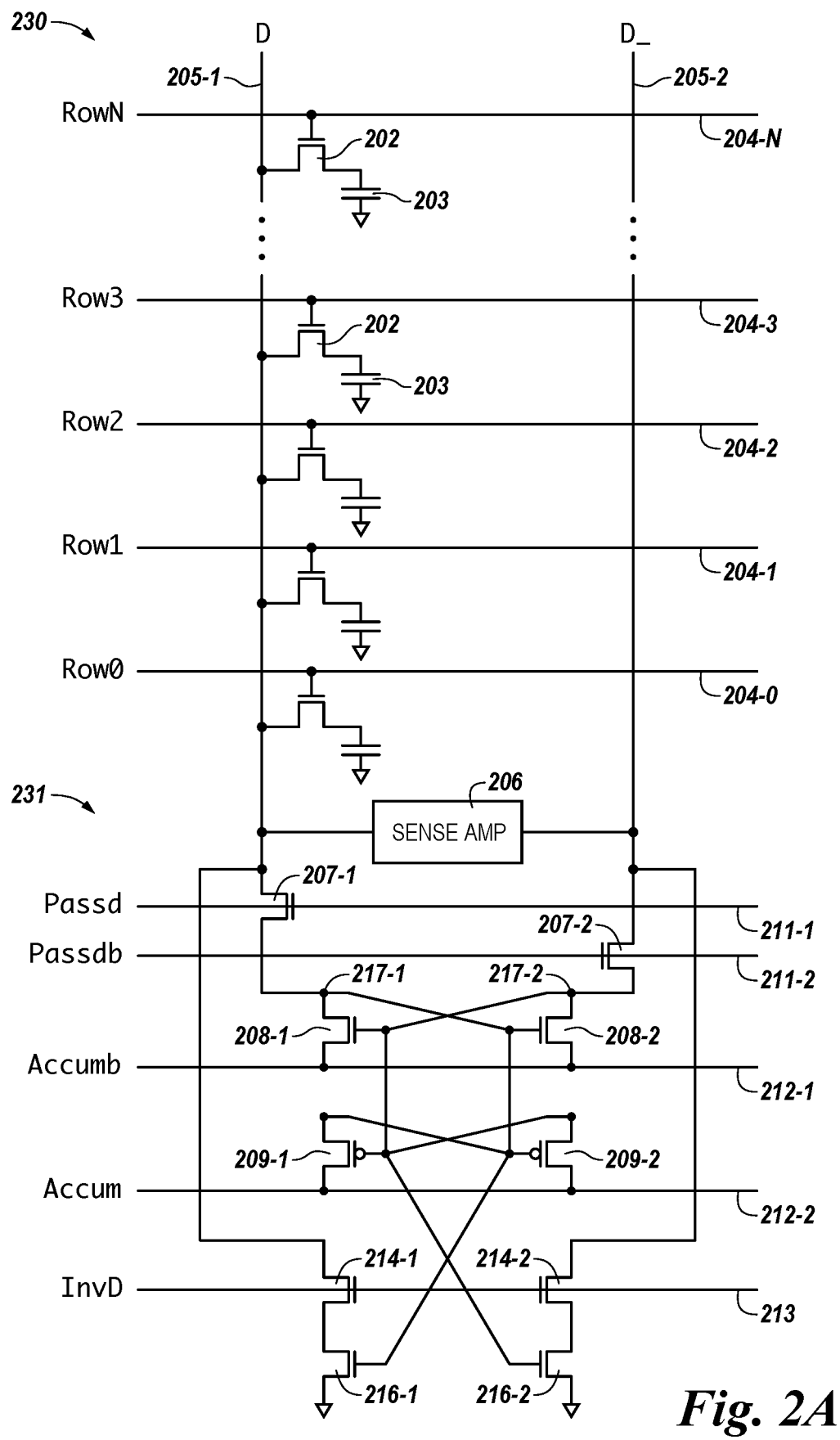
FIG. 2A illustrates a schematic diagram of a portion of a memory array coupled to sensing circuitry in accordance with a number of embodiments of the present disclosure.

FIG. 2A illustrates a schematic diagram of a portion of a memory array 230 coupled to sensing circuitry in accordance with a number of embodiments of the present disclosure. In this example, the memory array 230 is a DRAM array of 1T1C (one transistor one capacitor) memory cells each comprised of an access device 202 (e.g., transistor) and a storage element 203 (e.g., a capacitor). In a number of embodiments, the memory cells are destructive read memory cells (e.g., reading the data stored in the cell destroys the data such that the data originally stored in the cell is refreshed after being read). The cells of array 230 are arranged in rows coupled by word lines 204-0 (Row0), 204-1 (Row1), 204-2, (Row2) 204-3 (Row3), . . . , 204-N (RowN) and columns coupled by sense lines (e.g., digit lines) 205-1 (D) and 205-2 (D_). In this example, each column of cells is associated with a pair of complementary sense lines 205-1 (D) and 205-2 (D_). Although only a single column of memory cells is illustrated in FIG. 2A, embodiments are not so limited. For instance, a particular array may have a number of columns of memory cells and/or sense lines (e.g., 4,096, 8,192, 16,384, etc.). A gate of a particular memory cell transistor 202 is coupled to its corresponding word line 204-0, 204-1, 204-2, 204-3, . . . , 204-N, a first source/drain region is coupled to its corresponding sense line 205-1, and a second source/drain region of a particular memory cell transistor is coupled to its corresponding capacitor 203. Although not illustrated in FIG. 2A, the sense line 205-2 may also be coupled to a column of memory cells.

The array 230 is coupled to sensing circuitry in accordance with a number of embodiments of the present disclosure. In this example, the sensing circuitry comprises a sense amplifier 206 and a compute component 231. The sensing circuitry can be sensing circuitry 150 shown in FIG. 1. The sense amplifier 206 is coupled to the complementary sense lines D, D_ corresponding to a particular column of memory cells. The sense amplifier 206 can be a sense amplifier such as sense amplifier 306 described below in association with FIG. 3. As such, the sense amp 206 can be operated to determine a state (e.g., logic data value) stored in a selected cell. Embodiments are not limited to the example sense amplifier 206. For instance, sensing circuitry in accordance with a number of embodiments described herein can include current-mode sense amplifiers and/or single-ended sense amplifiers (e.g., sense amplifiers coupled to one sense line).

In a number of embodiments, a compute component (e.g., 231) can comprise a number of transistors formed on pitch with the transistors of the sense amp (e.g., 206) and/or the memory cells of the array (e.g., 230), which may conform to a particular feature size (e.g., $4F^2$, $6F^2$, etc.). As described further below, the compute component 231 can, in conjunction with the sense amp 206, operate to perform various logical operations using data from array 230 as input and store the result back to the array 230 without transferring the data via a sense line address access (e.g., without firing a column decode signal such that data is transferred to circuitry external from the array and sensing circuitry via local I/O lines). As such, a number of embodiments of the present disclosure can enable performing logical operations and computing functions associated therewith using less power than various previous approaches. Additionally, since a number of embodiments eliminate the need to transfer data across I/O lines in order to perform compute functions, a number of embodiments can enable an increased parallel processing capability as compared to previous approaches.

In the example illustrated in FIG. 2A, the circuitry corresponding to compute component 231 comprises five transistors coupled to each of the sense lines D and D_; however, embodiments are not limited to this example. Transistors 207-1 and 207-2 have a first source/drain region coupled to sense lines D and D_, respectively, and a second source/ drain region coupled to a cross coupled latch (e.g., coupled to gates of a pair of cross coupled transistors, such as cross coupled NMOS transistors 208-1 and 208-2 and cross coupled PMOS transistors 209-1 and 209-2). As described further herein, the cross coupled latch comprising transistors 208-1, 208-2, 209-1, and 209-2 can be referred to as a secondary latch (the cross coupled latch corresponding to sense amp 206 can be referred to herein as a primary latch).

The transistors 207-1 and 207-2 can be referred to as pass transistors, which can be enabled via respective signals 211-1 (Passd) and 211-2 (Passdb) in order to pass the voltages or currents on the respective sense lines D and D_ to the inputs of the cross coupled latch comprising transistors 208-1, 208-2, 209-1, and 209-2 (e.g., the input of the secondary latch). In this example, the second source/drain region of transistor 207-1 is coupled to a first source/drain region of transistors 208-1 and 209-1 as well as to the gates of transistors 208-2 and 209-2. Similarly, the second source/drain region of transistor 207-2 is coupled to a first source/drain region of transistors 208-2 and 209-2 as well as to the gates of transistors 208-1 and 209-1.

A second source/drain region of transistor 208-1 and 208-2 is commonly coupled to a negative control signal 212-1 (Accumb). A second source/drain region of transistors 209-1 and 209-2 is commonly coupled to a positive control signal 212-2 (Accum). The Accum signal 212-2 can be a supply voltage (e.g., VDD) and the Accumb signal can be a reference voltage (e.g., ground). Enabling signals 212-1 and 212-2 activates the cross coupled latch comprising transistors 208-1, 208-2, 209-1, and 209-2 corresponding to the secondary latch. The activated sense amp pair operates to amplify a differential voltage between common node 217-1 and common node 217-2 such that node 217-1 is driven to one of the Accum signal voltage and the Accumb signal voltage (e.g., to one of VDD and ground), and node 217-2 is driven to the other of the Accum signal voltage and the Accumb signal voltage. As described further below, the signals 212-1 and 212-2 are labeled "Accum" and "Accumb" because the secondary latch can serve as an accumulator while being used to perform a logical operation. In a number of embodiments, an accumulator comprises the cross coupled transistors 208-1, 208-2, 209-1, and 209-2 forming the secondary latch as well as the pass transistors 207-1 and 207-2. As described further herein, in a number of embodiments, a compute component comprising an accumulator coupled to a sense amplifier can be configured to perform a logical operation that comprises performing an accumulate operation on a data value represented by a signal (e.g., voltage or current) on at least one of a pair of complementary sense lines.

The compute component 231 also includes inverting transistors 214-1 and 214-2 having a first source/drain region coupled to the respective digit lines D and D_. A second source/drain region of the transistors 214-1 and 214-2 is coupled to a first source/drain region of transistors 216-1 and 216-2, respectively. The gates of transistors 214-1 and 214-2 are coupled to a signal 213 (InvD). The gate of transistor 216-1 is coupled to the common node 217-1 to which the gate of transistor 208-2, the gate of transistor 209-2, and the first source/drain region of transistor 208-1 are also coupled. In a complementary fashion, the gate of transistor 216-2 is coupled to the common node 217-2 to which the gate of transistor 208-1, the gate of transistor 209-1, and the first source/drain region of transistor 208-2 are also coupled. As such, enabling signal InvD serves to invert the data value stored in the secondary latch and drives the inverted value onto sense lines 205-1 and 205-2.

The compute component 231 shown in FIG. 2A can be operated (e.g., via the Passd, Passdb, Accumb, Accum, and InvD signals) to perform various logical operations including AND, NAND, OR, and NOR operations, among others. For instance, as described further below, sensing circuitry (e.g., sense amp 206 and compute component 231) in accordance with a number of embodiments can be operated to perform AND, NAND, OR, and NOR operations, among others. The logical operations can be R-input logical operations, with "R" representing a value of two or more.

For instance, an R-input logical operation can be performed using data stored in array 230 as inputs, and the result can be stored to a suitable location (e.g., back to array 230 and/or to a different location) via operation of the sensing circuitry. In the examples described below, an R-input logical operation includes using a data value (e.g., logic 1 or logic 0) stored in a memory cell coupled to a first particular word line (e.g., 204-0) and to a particular sense line (e.g., 205-1) as a first input and data values stored in memory cells coupled to a number of additional word lines (e.g., 204-1 to 204-N), and commonly coupled to the particular sense line (e.g., 205-1), as a respective number of additional inputs. In this manner, a number of logical operations can be performed in parallel. For instance, 4K logical operations could be performed in parallel on an array having 4K sense lines. In this example, 4K cells coupled to a first word line could serve as 4K first inputs, 4K cells coupled to a second word line could serve as 4K second inputs, and 4K cells coupled to a third word line could serve as 4K third inputs in a 3-input logical operation. As such, in this example, 4K separate 3-input logical operations can be performed in parallel.

In a number of embodiments, a first operation phase of an R-input logical operation includes performing a sensing operation on a memory cell coupled to a particular word line (e.g., 204-0) and to a particular sense line (e.g., 205-1) to determine its stored data value (e.g., logic 1 or logic 0), which serves as a first input in an R-input logical operation. The first input (e.g., the sensed stored data value) can then be transferred (e.g., copied) to a latch associated with compute component 231. A number of intermediate operation phases can be performed and can also include performing sensing operations on memory cells coupled to a respective number of additional word lines (e.g., 204-1 to 204-N) and to the particular sense line (e.g., 205-1) to determine their stored data values, which serve as a respective number of additional inputs (e.g., R−1 additional inputs) to the R-input logical operation. A last operation phase of an R-input logical operation involves operating the sensing circuitry to store the result of the logical operation to a suitable location. As an example, the result can be stored back to the array (e.g., back to a memory cell coupled to the particular sense line 205-1). Storing the result back to the array can occur without activating a column decode line. The result can also be stored to a location other than in array 230. For instance, the result can be stored (e.g., via local I/O lines coupled to sense amp 206) to an external register associated with a processing resource such as a host processor; however, embodiments are not so limited. Details regarding the first, intermediate, and last operation phases are described further below in association with FIGS. 2B, 2C-1, 2C-2, 2D-1, and 2D-2.

Figure 2B:
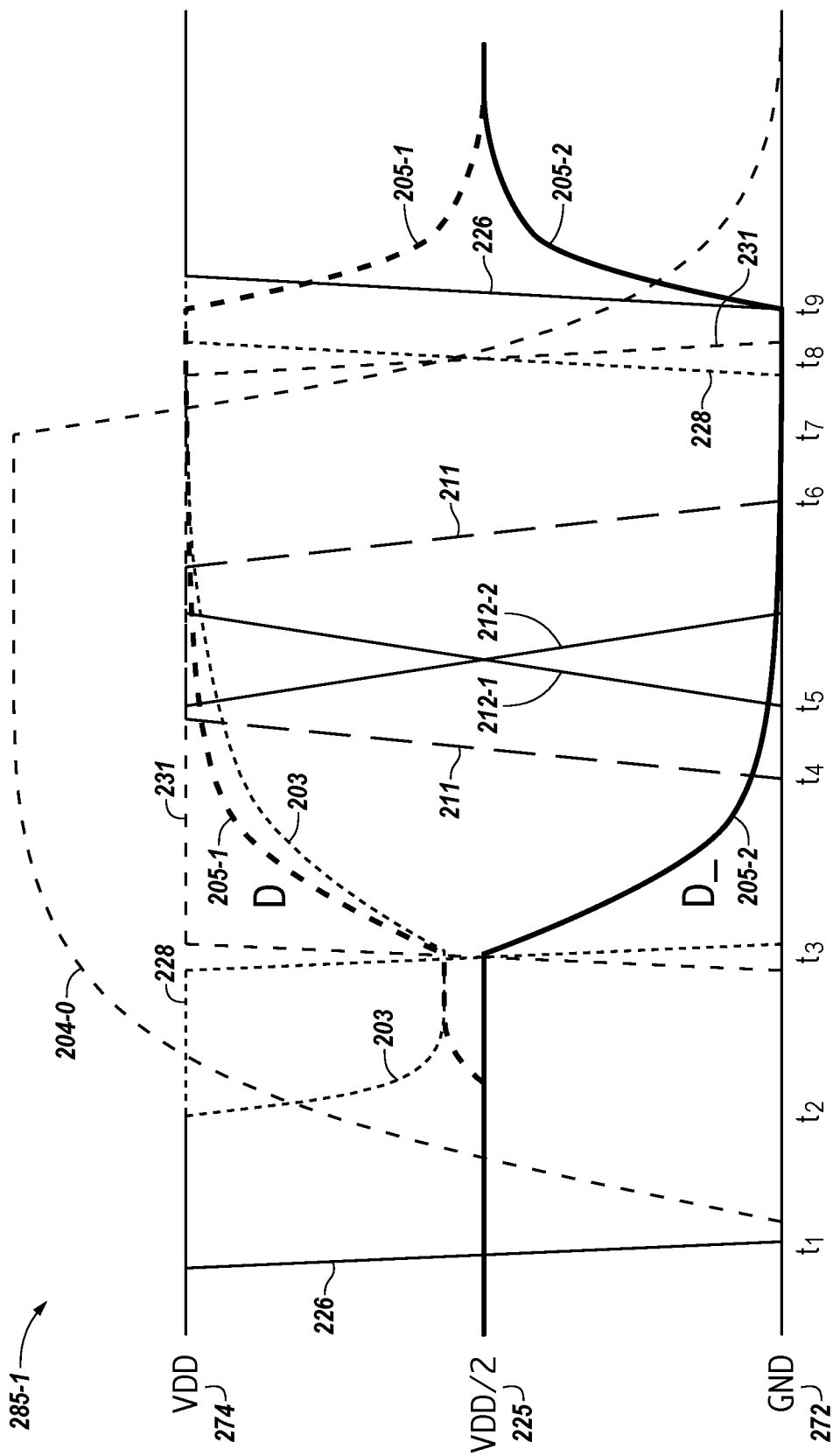
FIG. 2B illustrates a timing diagram associated with performing a number of logical operations using sensing circuitry in accordance with a number of embodiments of the present disclosure.

FIG. 2B illustrates a timing diagram 285-1 associated with performing a number of logical operations using sensing circuitry in accordance with a number of embodiments of the present disclosure. Timing diagram 285-1 illustrates signals (e.g., voltage signals) associated with performing a first operation phase of a logical operation (e.g., an R-input logical operation). The first operation phase described in FIG. 2B can be a first operation phase of an AND, NAND, OR, or NOR operation, for instance. As described further below, performing the operation phase illustrated in FIG. 2B can involve consuming significantly less energy (e.g., about half) than previous processing approaches, which may involve providing a full swing between voltage rails (e.g., between a supply and ground) to perform a compute function.

In the example illustrated in FIG. 2B, the voltage rails corresponding to complementary logic values (e.g., "1" and "0") are a supply voltage 274 (VDD) and a ground voltage 272 (Gnd). Prior to performing a logical operation, equilibration can occur such that the complementary sense lines D and D_ are shorted together at an equilibration voltage 225 (VDD/2). Equilibration is described further below in association with FIG. 3.

At time $t_1$, the equilibration signal 226 is deactivated, and then a selected row is activated (e.g., the row corresponding to a memory cell whose data value is to be sensed and used as a first input). Signal 204-0 represents the voltage signal applied to the selected row (e.g., row 204-0). When row signal 204-0 reaches the threshold voltage (Vt) of the access transistor (e.g., 202) corresponding to the selected cell, the access transistor turns on and couples the sense line D to the selected memory cell (e.g., to the capacitor 203 if the cell is a 1T1C DRAM cell), which creates a differential voltage signal between the sense lines D and D_ (e.g., as indicated by signals 205-1 and 205-2, respectively) between times $t_2$ and $t_3$. The voltage of the selected cell is represented by signal 203. Due to conservation of energy, creating the differential signal between D and D_ (e.g., by coupling the cell to sense line D) does not consume energy, since the energy associated with activating/deactivating the row signal 204 can be amortized over the plurality of memory cells coupled to the row.

At time $t_3$, the sense amp (e.g., 206) activates (e.g., the positive control signal 231 (e.g., PSA 331 shown in FIG. 3) goes high, and the negative control signal 228 (e.g., RNL_ 328) goes low), which amplifies the differential signal between D and D_, resulting in a voltage (e.g., VDD) corresponding to a logic 1 or a voltage (e.g., ground) corresponding to a logic 0 being on sense line D (and the other voltage being on complementary sense line D_), such that the sensed data value is stored in the primary latch of sense amp 206. The primary energy consumption occurs in charging the sense line D (205-1) from the equilibration voltage VDD/2 to the rail voltage VDD.

At time $t_4$, the pass transistors 207-1 and 207-2 are enabled (e.g., via respective Passd and Passdb control signals applied to control lines 211-1 and 211-2, respectively). The control signals 211-1 and 211-2 are referred to collectively as control signals 211. As used herein, various control signals, such as Passd and Passdb, may be referenced by referring to the control lines to which the signals are applied. For instance, a Passd signal can be referred to as control signal 211-1. At time $t_5$, the accumulator control signals Accumb and Accum are activated via respective control lines 212-1 and 212-2. As described below, the accumulator control signals 212-1 and 212-2 may remain activated for subsequent operation phases. As such, in this example, activating the control signals 212-1 and 212-2 activates the secondary latch (e.g., accumulator) of compute component 231. The sensed data value stored in sense amp 206 is transferred (e.g., copied) to the secondary latch.

At time $t_6$, the pass transistors 207-1 and 207-2 are disabled (e.g., turned off); however, since the accumulator control signals 212-1 and 212-2 remain activated, an accumulated result is stored (e.g., latched) in the secondary latch (e.g., accumulator). At time $t_7$, the row signal 204-0 is deactivated, and the array sense amps are deactivated at time $t_8$ (e.g., sense amp control signals 228 and 231 are deactivated).

At time $t_9$, the sense lines D and D_ are equilibrated (e.g., equilibration signal 226 is activated), as illustrated by sense line voltage signals 205-1 and 205-2 moving from their respective rail values to the equilibration voltage 225 (VDD/2). The equilibration consumes little energy due to the law of conservation of energy. As described below in association with FIG. 3, equilibration can involve shorting the complementary sense lines D and D_ together at an equilibration voltage, which is VDD/2, in this example. Equilibration can occur, for instance, prior to a memory cell sensing operation.

Figures 1, 2C:
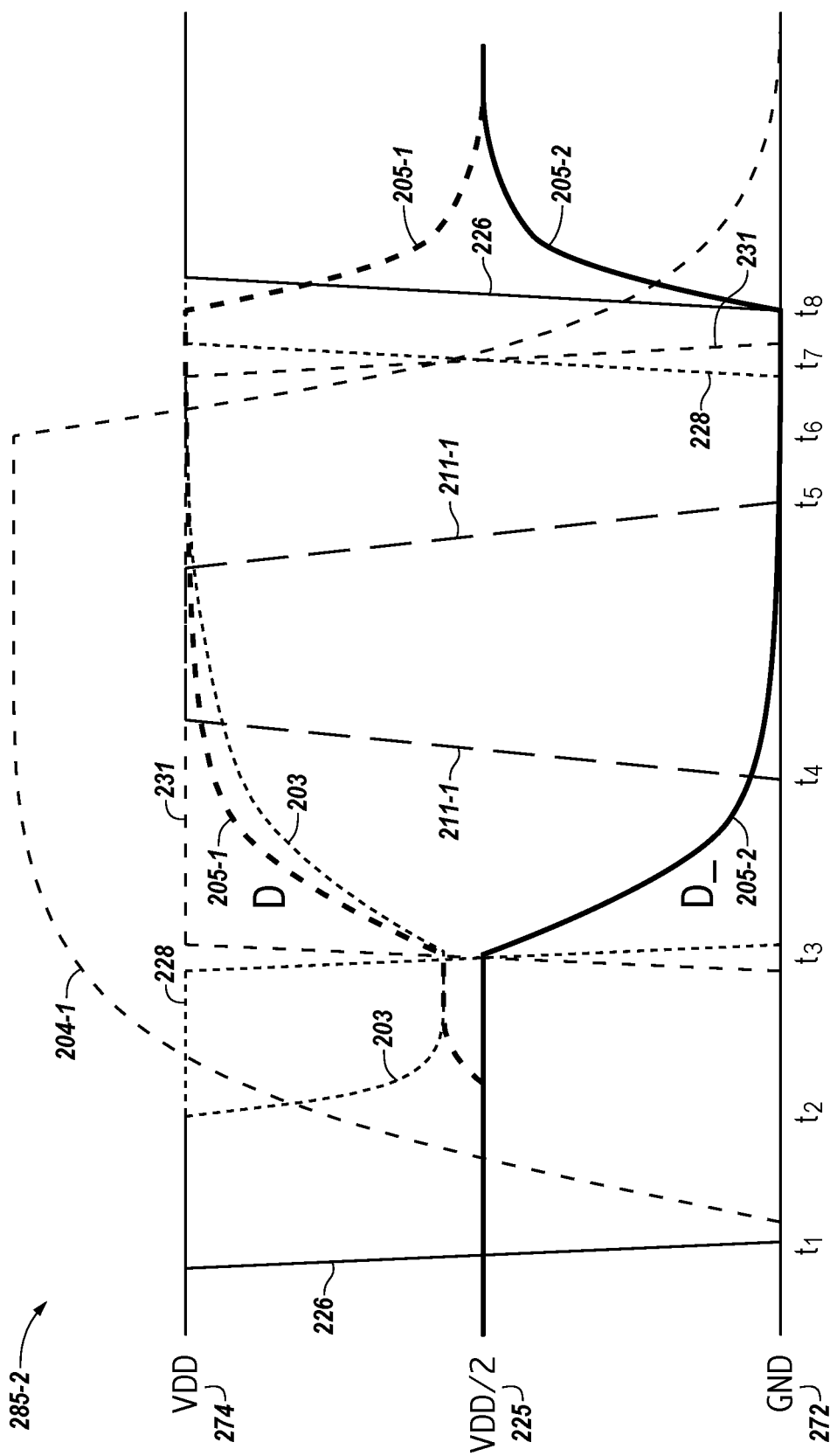
Figures 2, 2C:
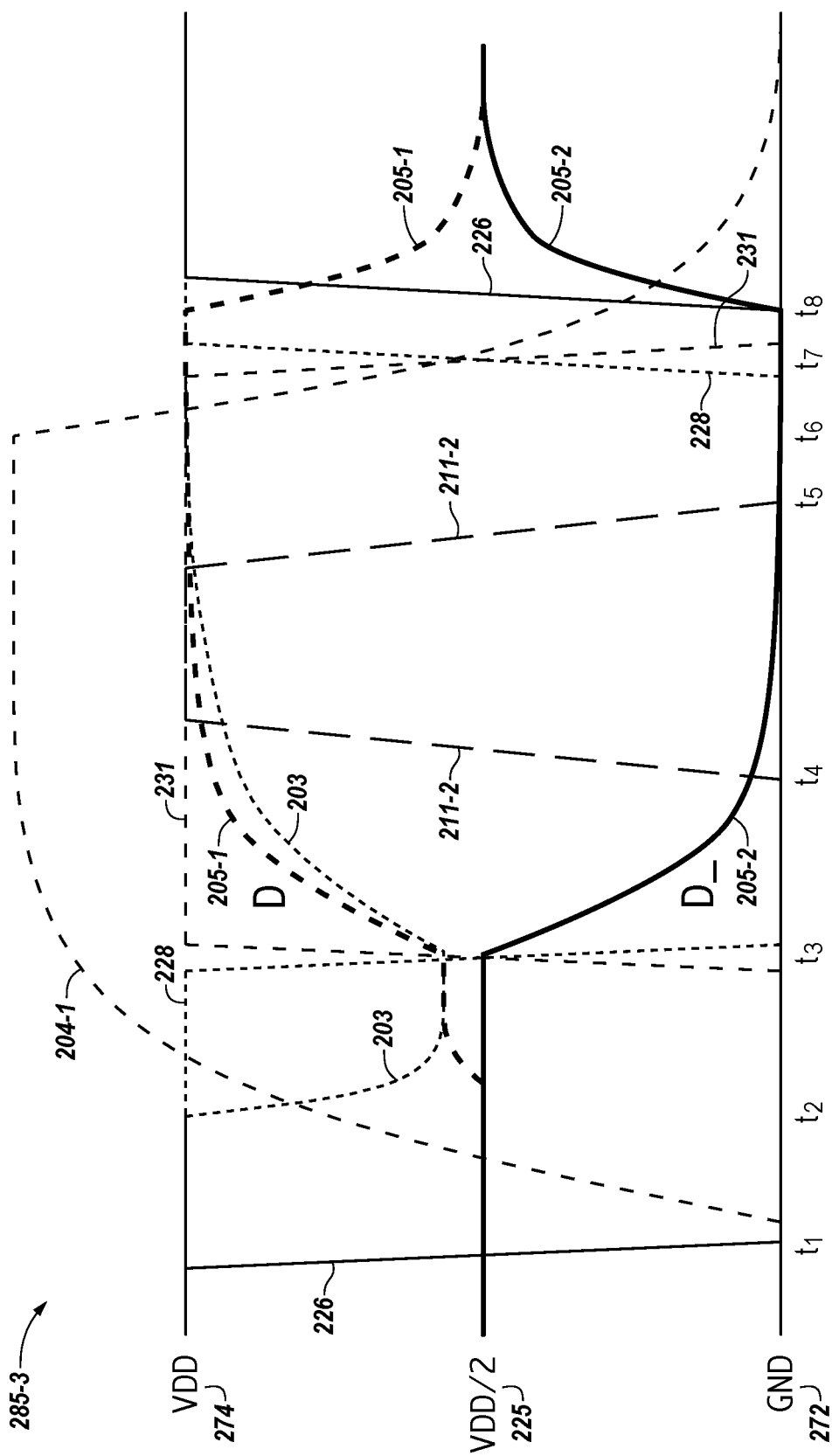

FIGS. 2C-1 and 2C-2 illustrate timing diagrams 285-2 and 285-3, respectively, associated with performing a number of logical operations using sensing circuitry in accordance with a number of embodiments of the present disclosure. Timing diagrams 285-2 and 285-3 illustrate signals (e.g., voltage signals) associated with performing a number of intermediate operation phases of a logical operation (e.g., an R-input logical operation). For instance, timing diagram 285-2 corresponds to a number of intermediate operation phases of an R-input NAND operation or an R-input AND operation, and timing diagram 285-3 corresponds to a number of intermediate operation phases of an R-input NOR operation or an R-input OR operation. For example, performing an AND or NAND operation can include performing the operation phase shown in FIG. 2C-1 one or more times subsequent to an initial operation phase such as that described in FIG. 2B. Similarly, performing an OR or NOR operation can include performing the operation phase shown in FIG. 2C-2 one or more times subsequent to an initial operation phase such as that described in FIG. 2B.

As shown in timing diagrams 285-2 and 285-3, at time $t_1$, equilibration is disabled (e.g., the equilibration signal 226 is deactivated), and then a selected row is activated (e.g., the row corresponding to a memory cell whose data value is to be sensed and used as an input such as a second input, third input, etc.). Signal 204-1 represents the voltage signal applied to the selected row (e.g., row 204-1). When row signal 204-1 reaches the threshold voltage (Vt) of the access transistor (e.g., 202) corresponding to the selected cell, the access transistor turns on and couples the sense line D to the selected memory cell (e.g., to the capacitor 203 if the cell is a 1T1C DRAM cell), which creates a differential voltage signal between the sense lines D and D_ (e.g., as indicated by signals 205-1 and 205-2, respectively) between times $t_2$ and $t_3$. The voltage of the selected cell is represented by signal 203. Due to conservation of energy, creating the differential signal between D and D_ (e.g., by coupling the cell to sense line D) does not consume energy, since the energy associated with activating/deactivating the row signal 204 can be amortized over the plurality of memory cells coupled to the row.

At time $t_3$, the sense amp (e.g., 206) activates (e.g., the positive control signal 231 (e.g., PSA 331 shown in FIG. 3) goes high, and the negative control signal 228 (e.g., RNL_ 328) goes low), which amplifies the differential signal between D and D_, resulting in a voltage (e.g., VDD) corresponding to a logic 1 or a voltage (e.g., ground) corresponding to a logic 0 being on sense line D (and the other voltage being on complementary sense line D_), such that the sensed data value is stored in the primary latch of sense amp 206. The primary energy consumption occurs in charging the sense line D (205-1) from the equilibration voltage VDD/2 to the rail voltage VDD.

As shown in timing diagrams 285-2 and 285-3, at time $t_4$ (e.g., after the selected cell is sensed), only one of control signals 211-1 (Passd) and 211-2 (Passdb) is activated (e.g., only one of pass transistors 207-1 and 207-2 is enabled), depending on the particular logic operation. For example, since timing diagram 285-2 corresponds to an intermediate phase of a NAND or AND operation, control signal 211-1 is activated at time $t_4$ and control signal 211-2 remains deactivated. Conversely, since timing diagram 285-3 corresponds to an intermediate phase of a NOR or OR operation, control signal 211-2 is activated at time $t_4$ and control signal 211-1 remains deactivated. Recall from above that the accumulator control signals 212-1 (Accumb) and 212-2 (Accum) were activated during the initial operation phase described in FIG. 2B, and they remain activated during the intermediate operation phase(s).

Since the accumulator was previously activated, activating only Passd (211-1) results in accumulating the data value corresponding to the voltage signal 205-1. Similarly, activating only Passdb (211-2) results in accumulating the data value corresponding to the voltage signal 205-2. For instance, in an example AND/NAND operation (e.g., timing diagram 285-2) in which only Passd (211-1) is activated, if the data value stored in the selected memory cell (e.g., a Row1 memory cell in this example) is a logic 0, then the accumulated value associated with the secondary latch is asserted low such that the secondary latch stores logic 0. If the data value stored in the Row1 memory cell is not a logic 0, then the secondary latch retains its stored Row0 data value (e.g., a logic 1 or a logic 0). As such, in this AND/NAND operation example, the secondary latch is serving as a zeroes (0s) accumulator. Similarly, in an example OR/NOR operation (e.g., timing diagram 285-3) in which only Passdb is activated, if the data value stored in the selected memory cell (e.g., a Row1 memory cell in this example) is a logic 1, then the accumulated value associated with the secondary latch is asserted high such that the secondary latch stores logic 1. If the data value stored in the Row1 memory cell is not a logic 1, then the secondary latch retains its stored Row0 data value (e.g., a logic 1 or a logic 0). As such, in this OR/NOR operation example, the secondary latch is effectively serving as a ones (1s) accumulator since voltage signal 205-2 on D_ is setting the true data value of the accumulator.

At the conclusion of an intermediate operation phase such as that shown in FIGS. 2C-1 and 2C-2, the Passd signal (e.g., for AND/NAND) or the Passdb signal (e.g., for OR/NOR) is deactivated (e.g., at time $t_5$), the selected row is deactivated (e.g., at time $t_6$), the sense amp is deactivated (e.g., at time $t_7$), and equilibration occurs (e.g., at time $t_8$). An intermediate operation phase such as that illustrated in FIG. 2C-1 or 2C-2 can be repeated in order to accumulate results from a number of additional rows. As an example, the sequence of timing diagram 285-2 or 285-3 can be performed a subsequent (e.g., second) time for a Row2 memory cell, a subsequent (e.g., third) time for a Row3 memory cell, etc. For instance, for a 10-input NOR operation, the intermediate phase shown in FIG. 2C-2 can occur 9 times to provide 9 inputs of the 10-input logical operation, with the tenth input being determined during the initial operation phase (e.g., as described in FIG. 2B).

Figures 1, 2D:
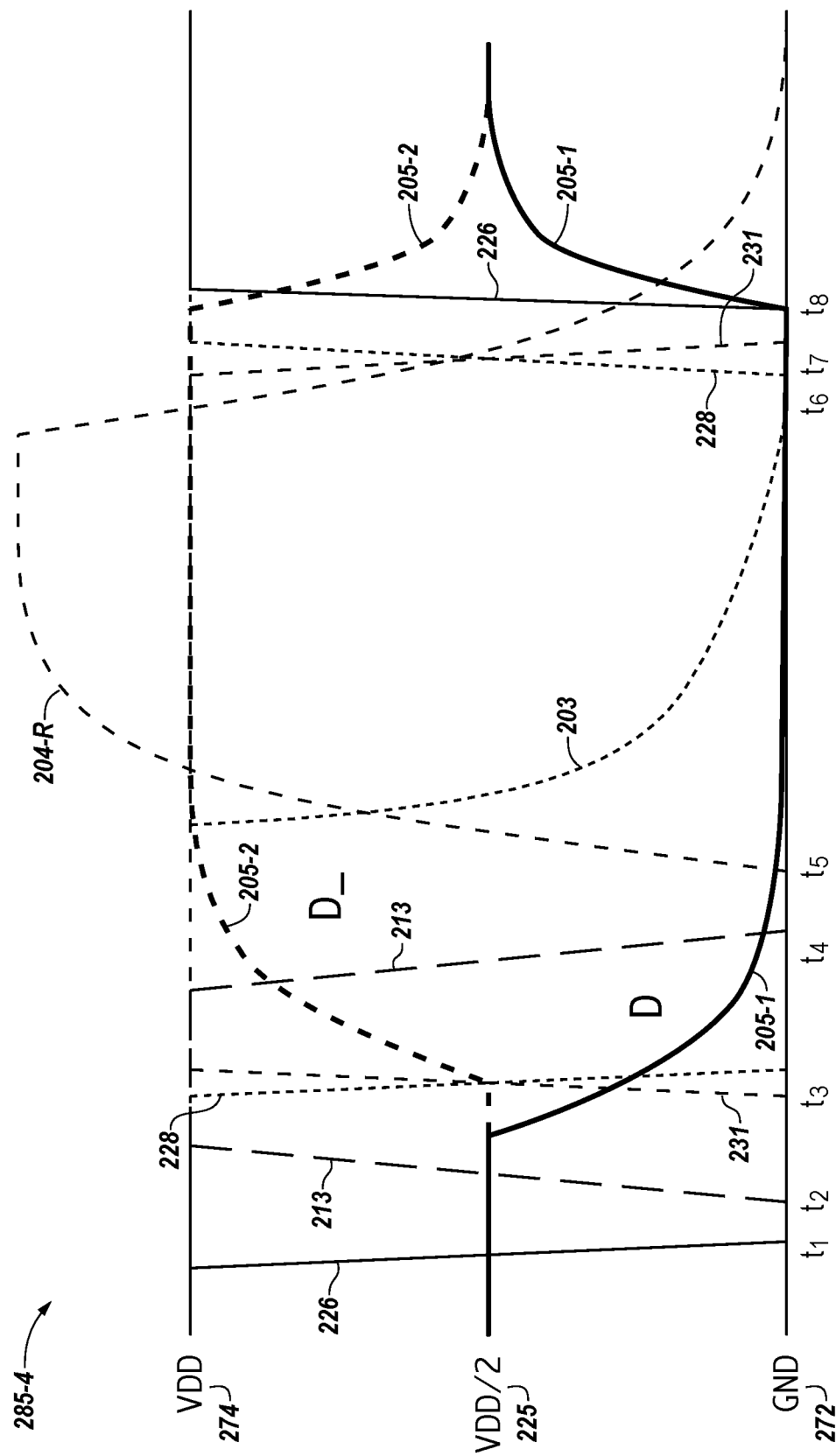
Figures 2, 2D:
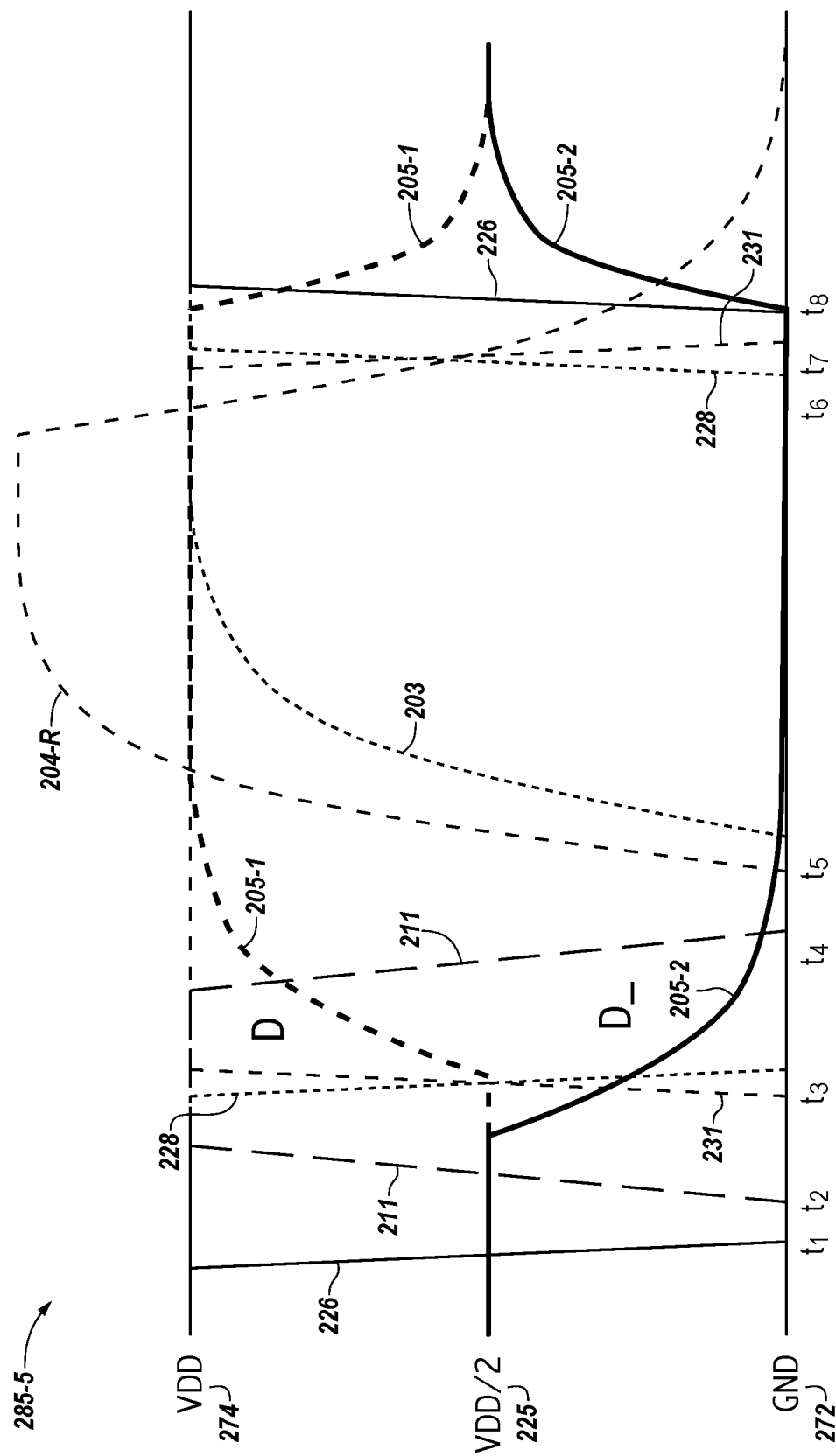

FIGS. 2D-1 and 2D-2 illustrate timing diagrams 285-4 and 285-5, respectively, associated with performing a number of logical operations using sensing circuitry in accordance with a number of embodiments of the present disclosure. Timing diagrams 285-4 and 285-5 illustrate signals (e.g., voltage signals) associated with performing a last operation phase of a logical operation (e.g., an R-input logical operation). For instance, timing diagram 285-4 corresponds to a last operation phase of an R-input NAND operation or an R-input NOR operation, and timing diagram 285-5 corresponds to a last operation phase of an R-input AND operation or an R-input OR operation. For example, performing a NAND operation can include performing the operation phase shown in FIG. 2D-1 subsequent to a number of iterations of the intermediate operation phase described in association with FIG. 2C-1, performing a NOR operation can include performing the operation phase shown in FIG. 2D-1 subsequent to a number of iterations of the intermediate operation phase described in association with FIG. 2C-2, performing an AND operation can include performing the operation phase shown in FIG. 2D-2 subsequent to a number of iterations of the intermediate operation phase described in association with FIG. 2C-1, and performing an OR operation can include performing the operation phase shown in FIG. 2D-2 subsequent to a number of iterations of the intermediate operation phase described in association with FIG. 2C-2. Table 1 shown below indicates the Figures corresponding to the sequence of operation phases associated with performing a number of R-input logical operations in accordance with a number of embodiments described herein.

TABLE 1

| Operation | FIG. 2B | FIG. 2C-1 | FIG. 2C-2 | FIG. 2D-1 | FIG. 2D-2 |
|---|---|---|---|---|---|
| AND | First phase | R-1 iterations | | | Last phase |
| NAND | First phase | R-1 iterations | | Last phase | |
| OR | First phase | | R-1 iterations | | Last phase |
| NOR | First phase | | R-1 iterations | Last phase | |

The last operation phases of FIGS. 2D-1 and 2D-2 are described in association with storing a result of an R-input logical operation to a row of the array (e.g., array 230). However, as described above, in a number of embodiments, the result can be stored to a suitable location other than back to the array (e.g., to an external register associated with a controller and/or host processor, to a memory array of a different memory device, etc., via I/O lines).

As shown in timing diagrams 285-4 and 285-5, at time $t_1$, equilibration is disabled (e.g., the equilibration signal 226 is deactivated) such that sense lines D and D_ are floating. At time $t_2$, either the InvD signal 213 or the Passd and Passdb signals 211 are activated, depending on which logical operation is being performed. In this example, the InvD signal 213 is activated for a NAND or NOR operation (see FIG. 2D-1), and the Passd and Passdb signals 211 are activated for an AND or OR operation (see FIG. 2D-2).

Activating the InvD signal 213 at time $t_2$ (e.g., in association with a NAND or NOR operation) enables transistors 214-1/214-2 and results in an inverting of the data value stored in the secondary latch as either sense line D or sense line D_ is pulled low. As such, activating signal 213 inverts the accumulated output. Therefore, for a NAND operation, if any of the memory cells sensed in the prior operation phases (e.g., the initial operation phase and one or more intermediate operation phases) stored a logic 0 (e.g., if any of the R-inputs of the NAND operation were a logic 0), then the sense line D_ will carry a voltage corresponding to logic 0 (e.g., a ground voltage) and sense line D will carry a voltage corresponding to logic 1 (e.g., a supply voltage such as VDD). For this NAND example, if all of the memory cells sensed in the prior operation phases stored a logic 1 (e.g., all of the R-inputs of the NAND operation were logic 1), then the sense line D_ will carry a voltage corresponding to logic 1 and sense line D will carry a voltage corresponding to logic 0. At time $t_3$, the primary latch of sense amp 206 is then activated (e.g., the sense amp is fired), driving D and D_ to the appropriate rails, and the sense line D now carries the NANDed result of the respective input data values as determined from the memory cells sensed during the prior operation phases. As such, sense line D will be at VDD if any of the input data values are a logic 0 and sense line D will be at ground if all of the input data values are a logic 1.

For a NOR operation, if any of the memory cells sensed in the prior operation phases (e.g., the initial operation phase and one or more intermediate operation phases) stored a logic 1 (e.g., if any of the R-inputs of the NOR operation were a logic 1), then the sense line D_ will carry a voltage corresponding to logic 1 (e.g., VDD) and sense line D will carry a voltage corresponding to logic 0 (e.g., ground). For this NOR example, if all of the memory cells sensed in the prior operation phases stored a logic 0 (e.g., all of the R-inputs of the NOR operation were logic 0), then the sense line D_ will carry a voltage corresponding to logic 0 and sense line D will carry a voltage corresponding to logic 1. At time $t_3$, the primary latch of sense amp 206 is then activated and the sense line D now contains the NORed result of the respective input data values as determined from the memory cells sensed during the prior operation phases. As such, sense line D will be at ground if any of the input data values are a logic 1 and sense line D will be at VDD if all of the input data values are a logic 0.

Referring to FIG. 2D-2, activating the Passd and Passdb signals 211 (e.g., in association with an AND or OR operation) transfers the accumulated output stored in the secondary latch of compute component 231 to the primary latch of sense amp 206. For instance, for an AND operation, if any of the memory cells sensed in the prior operation phases (e.g., the first operation phase of FIG. 2B and one or more iterations of the intermediate operation phase of FIG. 2C-1) stored a logic 0 (e.g., if any of the R-inputs of the AND operation were a logic 0), then the sense line D_ will carry a voltage corresponding to logic 1 (e.g., VDD) and sense line D will carry a voltage corresponding to logic 0 (e.g., ground). For this AND example, if all of the memory cells sensed in the prior operation phases stored a logic 1 (e.g., all of the R-inputs of the AND operation were logic 1), then the sense line D_ will carry a voltage corresponding to logic 0 and sense line D will carry a voltage corresponding to logic 1. At time $t_3$, the primary latch of sense amp 206 is then activated and the sense line D now carries the ANDed result of the respective input data values as determined from the memory cells sensed during the prior operation phases. As such, sense line D will be at ground if any of the input data values are a logic 0 and sense line D will be at VDD if all of the input data values are a logic 1.

For an OR operation, if any of the memory cells sensed in the prior operation phases (e.g., the first operation phase of FIG. 2B and one or more iterations of the intermediate operation phase shown in FIG. 2C-2) stored a logic 1 (e.g., if any of the R-inputs of the OR operation were a logic 1), then the sense line D_ will carry a voltage corresponding to logic 0 (e.g., ground) and sense line D will carry a voltage corresponding to logic 1 (e.g., VDD). For this OR example, if all of the memory cells sensed in the prior operation phases stored a logic 0 (e.g., all of the R-inputs of the OR operation were logic 0), then the sense line D will carry a voltage corresponding to logic 0 and sense line D_ will carry a voltage corresponding to logic 1. At time $t_3$, the primary latch of sense amp 206 is then activated and the sense line D now carries the ORed result of the respective input data values as determined from the memory cells sensed during the prior operation phases. As such, sense line D will be at VDD if any of the input data values are a logic 1 and sense line D will be at ground if all of the input data values are a logic 0.

The result of the R-input AND, OR, NAND, and NOR operations can then be stored back to a memory cell of array 230. In the examples shown in FIGS. 2D-1 and 2D-2, the result of the R-input logical operation is stored to a memory cell coupled to RowR (e.g., 204-R). Storing the result of the logical operation to the RowR memory cell simply involves enabling the RowR access transistor 202 by activating RowR. The capacitor 203 of the RowR memory cell will be driven to a voltage corresponding to the data value on the sense line D (e.g., logic 1 or logic 0), which essentially overwrites whatever data value was previously stored in the RowR memory cell. It is noted that the RowR memory cell can be a same memory cell that stored a data value used as an input for the logical operation. For instance, the result of the logical operation can be stored back to the Row0 memory cell or Row1 memory cell.

Timing diagrams 285-4 and 285-5 illustrate, at time $t_3$, the positive control signal 231 and the negative control signal 228 being deactivated (e.g., signal 231 goes high and signal 228 goes low) to activate the sense amp 206. At time $t_4$ the respective signal (e.g., 213 or 211) that was activated at time $t_2$ is deactivated. Embodiments are not limited to this example. For instance, in a number of embodiments, the sense amp 206 may be activated subsequent to time $t_4$ (e.g., after signal 213 or signals 211 are deactivated).

As shown in FIGS. 2D-1 and 2D-2, at time $t_5$, RowR (204-R) is activated, which drives the capacitor 203 of the selected cell to the voltage corresponding to the logic value stored in the accumulator. At time $t_6$, Row R is deactivated, at time $t_7$, the sense amp 206 is deactivated (e.g., signals 228 and 231 are deactivated) and at time $t_8$ equilibration occurs (e.g., signal 226 is activated and the voltages on the complementary sense lines 205-1/205-2 are brought to the equilibration voltage).

In a number of embodiments, sensing circuitry such as that described in FIG. 2A (e.g., circuitry formed on pitch with the memory cells) can enable performance of numerous logical operations in parallel. For instance, in an array having 16K columns, 16K logical operations can be performed in parallel, without transferring data from the array and sensing circuitry via a bus and/or without transferring data from the array and sensing circuitry via I/O lines.

Also, one of ordinary skill in the art will appreciate that the ability to perform R-input logical operations (e.g., NAND, AND, NOR, OR, etc.) can enable performance of more complex computing functions such as addition, subtraction, and multiplication, among other primary math functions and/or pattern compare functions. For example, a series of NAND operations can be combined to perform a full adder function. As an example, if a full adder requires 12 NAND gates to add two data values along with a carry in and carry out, a total of 384 NAND operations (12×32) could be performed to add two 32 bit numbers. Embodiments of the present disclosure can also be used to perform logical operations that may be non-boolean (e.g., copy, compare, etc.).

Additionally, in a number of embodiments, the inputs to a logical operation performed may not be data values stored in the memory array to which the sensing circuitry (e.g., 150) is coupled. For instance, a number of inputs to a logical operation can be sensed by a sense amplifier (e.g., 206) without activating a row of the array (e.g., 230). As an example, the number of inputs can be received by the sense amp 206 via I/O lines coupled thereto (e.g., I/O lines 334-1 and 334-2 shown in FIG. 3). Such inputs may be provided to the sense amp 206 (e.g., via the appropriate I/O lines) from a source external to the array 230 such as from a host processor (e.g., host 110) and/or external controller, for instance. As another example, in association with performing a logical operation, the inputs to a particular sense amp (e.g., 206) and its corresponding compute component (e.g., 231) may be received from a different sense amp/compute component pair. For instance, a data value (e.g., logical result) stored in a first accumulator coupled to a first column of cells may be transferred to a different (e.g., neighboring) sense amp/compute component pair associated with a different column of cells, which may or may not be located in the same array as the first column.

Embodiments of the present disclosure are not limited to the particular sensing circuitry configuration illustrated in FIG. 2A. For instance, different compute component circuitry can be used to perform logical operations in accordance with a number of embodiments described herein. Although not illustrated in FIG. 2A, in a number of embodiments, control circuitry can be coupled to array 230, sense amp 206, and/or compute component 231. Such control circuitry may be implemented on a same chip as the array and sensing circuitry and/or on an external processing resource such as an external processor, for instance, and can control enabling/disabling various signals corresponding to the array and sensing circuitry in order to perform logical operations as described herein.

The example logic operation phases described in association with FIGS. 2A, 2B, 2C-1, 2C-2, 2D-1, and 2D-2 involve accumulating a data value (e.g., a data value sensed from a memory cell and/or a data value corresponding to a voltage or current of a sense line). Due to conservation of energy, the energy consumed in performing the logic operation phase is approximately equal to the energy consumed during charging of the capacitance of the sense line D or D_ from VDD/2 to VDD, which begins when the sense amp is activated (e.g., at time $t_3$ as shown in FIGS. 2B, 2C-1, 2C-2, 2D-1, and 2D-2). As such, performing a logical operation consumes approximately the energy used to charge a sense line (e.g., digit line) from VDD/2 to VDD. In contrast, various previous processing approaches often consume at least an amount of energy used to charge a sense line from rail to rail (e.g., from ground to VDD), which may be twice as much energy or more as compared to embodiments described herein.

Figure 3:
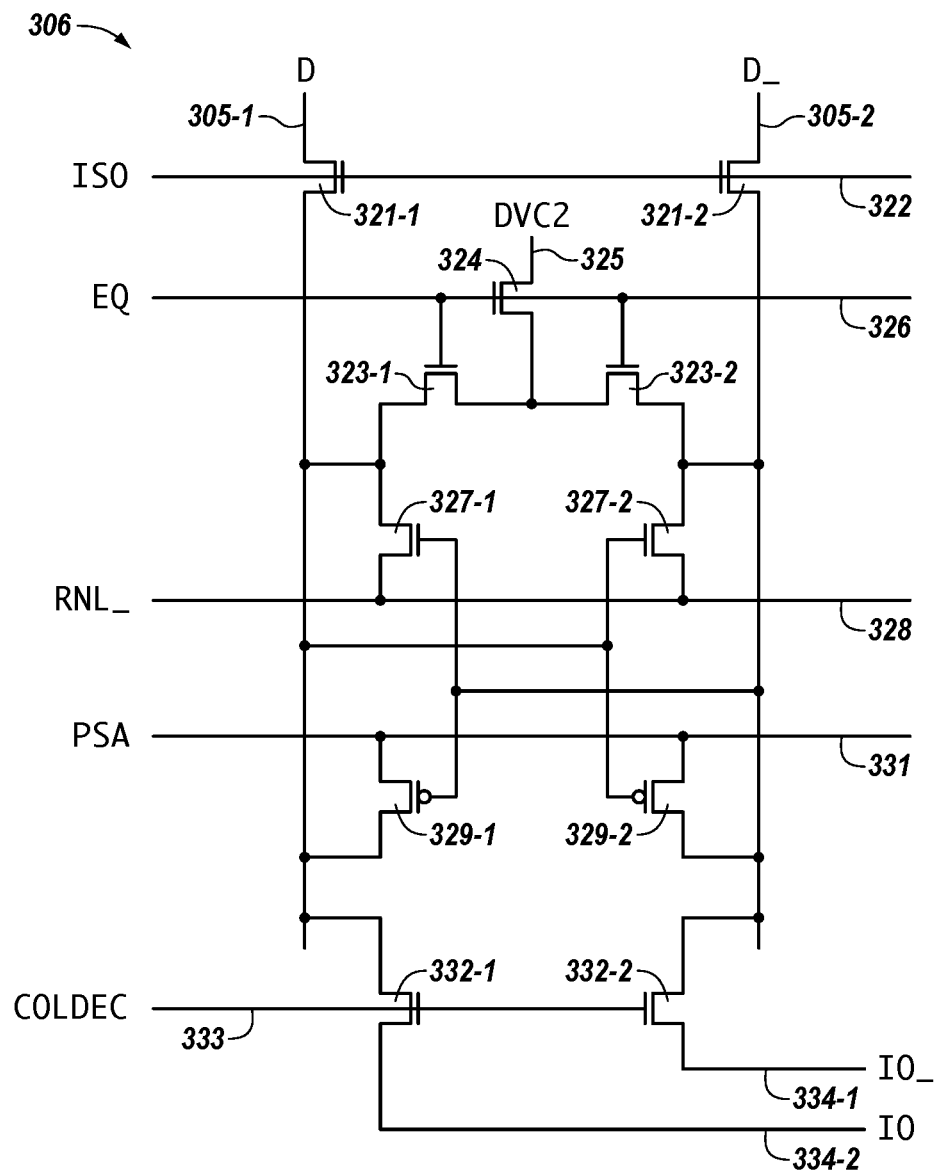
FIG. 3 illustrates a schematic diagram of a portion of sensing circuitry in accordance with a number of embodiments of the present disclosure.

FIG. 3 illustrates a schematic diagram of a portion of sensing circuitry in accordance with a number of embodiments of the present disclosure. In this example, the portion of sensing circuitry comprises a sense amplifier 306. In a number of embodiments, one sense amplifier 306 (e.g., "sense amp") is provided for each column of memory cells in an array (e.g., array 130). The sense amp 306 can be sense amp of a DRAM array, for instance. In this example, sense amp 306 is coupled to a pair of complementary sense lines 305-1 ("D") and 305-2 ("D_"). As such, the sense amp 306 is coupled to all of the memory cells in a respective column through sense lines D and D_.

The sense amplifier 306 includes a pair of cross coupled n-channel transistors (e.g., NMOS transistors) 327-1 and 327-2 having their respective sources coupled to a negative control signal 328 (RNL_) and their drains coupled to sense lines D and D_, respectively. The sense amplifier 306 also includes a pair of cross coupled p-channel transistors (e.g., PMOS transistors) 329-1 and 329-2 having their respective sources coupled to a positive control signal 331 (PSA) and their drains coupled to sense lines D and D_, respectively.

The sense amp 306 includes a pair of isolation transistors 321-1 and 321-2 coupled to sense lines D and D_, respectively. The isolation transistors 321-1 and 321-2 are coupled to a control signal 322 (ISO) that, when activated, enables (e.g., turns on) the transistors 321-1 and 321-2 to connect the sense amp 306 to a column of memory cells. Although not illustrated in FIG. 3, the sense amp 306 may be coupled to a first and a second memory array and can include another pair of isolation transistors coupled to a complementary control signal (e.g., ISO_), which is deactivated when ISO is deactivated such that the sense amp 306 is isolated from a first array when sense amp 306 is coupled to a second array, and vice versa.

The sense amp 306 also includes circuitry configured to equilibrate the sense lines D and D_. In this example, the equilibration circuitry comprises a transistor 324 having a first source/drain region coupled to an equilibration voltage 325 (dvc2), which can be equal to VDD/2, where VDD is a supply voltage associated with the array. A second source/drain region of transistor 324 is coupled to a common first source/drain region of a pair of transistors 323-1 and 323-2. The second source drain regions of transistors 323-1 and 323-2 are coupled to sense lines D and D_, respectively. The gates of transistors 324, 323-1, and 323-2 are coupled to control signal 326 (EQ). As such, activating EQ enables the transistors 324, 323-1, and 323-2, which effectively shorts sense line D to sense line D_ such that the sense lines D and D_ are equilibrated to equilibration voltage dvc2.

The sense amp 306 also includes transistors 332-1 and 332-2 whose gates are coupled to a signal 333 (COLDEC). Signal 333 may be referred to as a column decode signal or a column select signal. The sense lines D and D_ are connected to respective local I/O lines 334-1 (IO) and 334-2 (IO_) responsive to enabling signal 333 (e.g., to perform an operation such as a sense line access in association with a read operation). As such, signal 333 can be activated to transfer a signal corresponding to the state (e.g., a logic data value such as logic 0 or logic 1) of the memory cell being accessed out of the array on the I/O lines 334-1 and 334-2.

In operation, when a memory cell is being sensed (e.g., read), the voltage on one of the sense lines D, D_ will be slightly greater than the voltage on the other one of sense lines D, D_. The PSA signal is then driven high and the RNL_ signal is driven low to activate the sense amplifier 306. The sense line D, D having the lower voltage will turn on one of the PMOS transistor 329-1, 329-2 to a greater extent than the other of PMOS transistor 329-1, 329-2, thereby driving high the sense line D, D_ having the higher voltage to a greater extent than the other sense line D, D_ is driven high. Similarly, the sense line D, D_ having the higher voltage will turn on one of the NMOS transistor 327-1, 327-2 to a greater extent than the other of the NMOS transistor 327-1, 327-2, thereby driving low the sense line D, D_ having the lower voltage to a greater extent than the other sense line D, D_ is driven low. As a result, after a short delay, the sense line D, D_ having the slightly greater voltage is driven to the voltage of the PSA signal (which can be the supply voltage VDD), and the other sense line D, D_ is driven to the voltage of the RNL_ signal (which can be a reference potential such as a ground potential). Therefore, the cross coupled NMOS transistors 327-1, 327-2 and PMOS transistors 329-1, 329-2 serve as a sense amp pair, which amplify the differential voltage on the sense lines D and D_ and serve to latch a data value sensed from the selected memory cell. As used herein, the cross coupled latch of sense amp 306 may be referred to as a primary latch. In contrast, and as described above in connection with FIG. 2A, a cross coupled latch associated with a compute component (e.g., compute component 231 shown in FIG. 2A) may be referred to as a secondary latch.

CONCLUSION

The present disclosure includes apparatuses and methods related to performing logical operations using sensing circuitry. An example apparatus comprises an array of memory cells and sensing circuitry comprising a primary latch coupled to a sense line of the array. The sensing circuitry can be configured to perform a first operation phase of a logical operation by sensing a memory cell coupled to the sense line, perform a number of intermediate operation phases of the logical operation by sensing a respective number of different memory cells coupled to the sense line, and accumulate a result of the first operation phase and the number of intermediate operation phases in a secondary latch coupled to the primary latch without performing a sense line address access.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
    a host configured to generate instructions, wherein the host comprises a processing resource; and
    a memory device coupled to the processing resource and comprising an array of memory cells configured to store operands on which the instructions will be executed; and
    control circuitry configured to execute the instructions from the processing resource by causing logical operations to be performed on operands stored in memory cells of the array, without transferring the operands to the processing resource, by operating compute components coupled to the array as accumulators.

2. The system of claim 1, wherein the compute components comprise respective latches and are coupled to respective sense amplifiers of a plurality of sense amplifiers coupled to respective columns of the array.

3. The system of claim 1, wherein the array comprises N columns of memory cells, and wherein the control circuitry is configured to cause performance of N logical operations, in parallel, on operands stored in respective ones of the N columns of memory cells.

4. The system of claim 3, wherein the N logical operations comprise AND logical operations.

5. The system of claim 3, wherein the N logical operations comprise NAND logical operations.

6. The system of claim 3, wherein the N logical operations comprise OR logical operations.

7. The system of claim 3, wherein the N logical operations comprise NOR logical operations.

8. The system of claim 1, wherein the control circuitry comprises a state machine, a sequencer, or both.

9. The system of claim 1, wherein the processing resource comprises a host processor configured to generate the instructions.

10. A system, comprising:
    a host comprising a processing resource and configured to generate instructions; and
    a memory device coupled to the host and comprising an array coupled to a sense amplifier;
    wherein the sense amplifier comprises a first latch coupled to a sense line of the array, and wherein a second latch is coupled to the first latch; and
    wherein, responsive to an instruction received from the host, the first latch and the second latch are controlled to perform a logical operation by:
        performing a first operation phase that comprises sensing a memory cell coupled to the sense line; and
        performing a number of intermediate operation phases, wherein each one of the number of intermediate operations comprises sensing one of a respective number of different memory cells coupled to the sense line;
    wherein subsequent to the number of intermediate operation phases, an accumulated result of the logical operation resides in the second latch.

11. The system of claim 10, wherein the second latch is a latch of a compute component.

12. The system of claim 11, wherein the logical operation is a logical OR operation, and wherein the first latch and the second latch are further controlled to obtain a NOR logical operation result by inverting, via an invert signal provided to the compute component, the accumulated result of the logical OR operation residing in the second latch.

13. The system of claim 10, wherein the first latch and the second latch are further controlled to transfer the logical operation result from the second latch to the first latch.

14. The system of claim 10, wherein the second latch is a latch of a compute component, and wherein the first latch and the second latch are controlled to transfer the logical operation result from the second latch to the first latch via enabling of the first latch while an invert signal is provided to the compute component.

15. The system of claim 10, wherein the host comprises a processor external to the memory device.

16. A method of operating a system, the method comprising:
receiving instructions at a memory device from a host; and
executing the instructions on the memory device, wherein executing the instructions comprises performing a logical operation by:
performing a first operation phase that includes:
activating a first access line of the array, the first access line coupled to a first memory cell storing a data value corresponding to a first input of the logical operation;
activating a first latch coupled to a sense line to which the first memory cell is coupled in order to latch the data value therein;
activating a second latch to copy the data value latched in the first latch to the second latch; and
performing a second operation phase that includes:
activating a second access line to which a second memory cell is coupled, the second memory cell storing a data value corresponding to a second input of the logical operation;
while the second access line is activated, activating the first latch; and
wherein subsequent to activating the first latch while the second access line is activated, the second latch stores an accumulated result of the logical operation.

17. The method of claim 16, wherein the logical operation is a logical AND operation, and wherein the method includes obtaining a NAND logical operation result by inverting, via an invert signal provided to a compute component comprising the second latch, the accumulated result of the logical AND operation stored in the second latch subsequent to the second operation phase.

18. The method of claim 16, wherein the memory device comprises a controller, and wherein receiving instructions at the memory device comprises receiving instructions to the controller via a host interface.

19. The method of claim 16, wherein the logical operation is a logical AND operation, and wherein performing the logical AND operation further comprises performing a last operation phase comprising:
copying the accumulated result of the logical AND operation stored in the second latch to a particular memory cell of the array by activating the particular row.

20. The method of claim 16, wherein the method includes providing the accumulated result of the logical operation to the host.

* * * * *